United States Patent
Mornan et al.

(10) Patent No.: US 9,763,363 B2
(45) Date of Patent: Sep. 12, 2017

(54) CLIMATE CONTROL SYSTEM FOR DATA CENTER

(71) Applicants: Brian J. Mornan, Basking Ridge, NJ (US); Frank J. Beitz, Flemington, NJ (US); Nicholas J. Almerini, North Haledon, NJ (US)

(72) Inventors: Brian J. Mornan, Basking Ridge, NJ (US); Frank J. Beitz, Flemington, NJ (US); Nicholas J. Almerini, North Haledon, NJ (US)

(73) Assignee: Dyna-Tech Sales Corporation, Branchburg, NJ (US)

( * ) Notice: Subject to any disclaimer, the term of this patent is extended or adjusted under 35 U.S.C. 154(b) by 380 days.

(21) Appl. No.: 14/592,361

(22) Filed: Jan. 8, 2015

(65) Prior Publication Data

US 2015/0208552 A1    Jul. 23, 2015

Related U.S. Application Data

(60) Provisional application No. 61/929,024, filed on Jan. 18, 2014.

(51) Int. Cl.
*H05K 7/20* (2006.01)
(52) U.S. Cl.
CPC ......... *H05K 7/20745* (2013.01); *H05K 7/206* (2013.01); *H05K 7/207* (2013.01); *H05K 7/20754* (2013.01)
(58) Field of Classification Search
CPC .... H05K 7/206; H05K 7/207; H05K 7/20745; H05K 7/20754; F24F 12/006; F24F 11/0079; F24F 11/0012
See application file for complete search history.

(56) References Cited

U.S. PATENT DOCUMENTS

| | | | |
|---|---|---|---|
| 7,753,766 B2 | 7/2010 | Master et al. | |
| 2012/0087086 A1* | 4/2012 | Kok | F24F 11/0012 361/679.47 |

(Continued)

FOREIGN PATENT DOCUMENTS

JP         201143291      *  3/2011

OTHER PUBLICATIONS

Dazai, JP201143291MT (English Translation), Mar. 2011.*

*Primary Examiner* — Justin Jonaitis
*Assistant Examiner* — Eric Ruppert
(74) *Attorney, Agent, or Firm* — Thomas J. Germinario (57) ABSTRACT

Optimized conditioning of Information and Communication Technology (ICT) centers containing sensible heat generating equipment is achieved by indirect air-side economizing. In this process, the conditioned primary air stream is recirculated through a plate-type cross-flow heat exchanger, in which the cross-flow consists of a completely segregated cooler secondary ambient air stream. The air-to-air cross-flow heat exchanger comprises a series of parallel square or rectangular plates, which define a series of orthogonally alternating air passageways. This cross-flow design effectively prevents the mixing or blending of the primary and secondary air streams and thus avoids the efficiency losses and process airstream cross-contamination due to leakage, which is inherent in wheel type heat exchangers. The unique modular tunnel design of the cross-flow plate heat exchanger arrangement offers unit scalability and adjustability for various capacities and space demands. Real-time sensing of thermal demands and variable capacity control, coupled with on-demand mechanical cooling and humidification provisions, facilitate continuous operational optimization in all demands and ambient conditions.

7 Claims, 8 Drawing Sheets

(56) References Cited

U.S. PATENT DOCUMENTS

2012/0171943 A1* 7/2012 Dunnavant ........ H05K 7/20745
  454/184
2013/0176675 A1* 7/2013 Hundertmark ........ F24F 12/006
  361/679.31

* cited by examiner

CLIMATE CONTROL SYSTEM FOR DATA CENTER

REFERENCE TO RELATED APPLICATION

The present application claims the benefit of the filing date of Provisional Application No. 61/929,024, filed Aug. 18, 2014.

FIELD OF INVENTION

The present invention relates to the technical field of devices and methods for controlling temperature and humidity in data centers. More particularly, the present invention relates to a system of temperature and humidity conditioning of a primary recirculation air stream by means of heat transfer with a cooler secondary air stream via indirect air side economizing.

BACKGROUND OF THE INVENTION

Data centers contain information and communications technology (ICT) equipment, such as server and network equipment as well as computers. Depending on the design of such equipment, it generates a comparatively large quantity of sensible heat that must be continually removed so as to maintain the data center climate within a design range of temperature and humidity.

Since mechanical climate control systems relying solely on refrigerant or liquid-based cooling are costly and have a negative impact on the environment, there has been an impetus toward the use of heat exchange between cooler ambient air and the heated recirculating air within the data center. Leveraging the heat exchanger paradigm, data centers are able to limit the use of mechanical cooling and rely wholly or in part on temperature differential to provide adequate heat rejection. This concept is known as "free-cooling". Such designs have employed an air-to-air heat exchanger of the rotary type, or heat wheel, comprising a rotating disc-shaped perforated metallic plate, which extends through a partition separating the primary recirculating air stream from the secondary outside air stream.

The use of a rotary heat wheel, however, involves several disadvantages. Inherent in the design is air leakage between the primary and secondary air streams through the breach in the partition needed to accommodate the rotating heat wheel. Since brushes and air sealing gaskets cannot completely stop leakage, energy transfer efficiency is diminished. Additionally, information and communications technology (ICT) equipment is often very sensitive to fluctuations in humidity and the presence of airborne contaminates and/or particulate. Since, leakage is an inherent characteristic of the heat wheel, this method results in unfiltered/unconditioned ambient air infiltrating into the critical space where ICT equipment is housed, which is highly undesirable.

The heat wheel must continuously rotate in order to realize any heat transfer potential. Significant electrical energy is consumed in powering the electric motor that rotates the heat wheel. Moreover, the heat wheel consists of moving parts which must be regularly inspected and maintained by trained professionals. The passage of both air streams through the perforations of the heat wheel causes a substantial pressure drop, which must be compensated for by providing more fan power. Heat wheels also require life-cycle replacement, typically after ten years. Therefore, inherent leakage characteristics, utility costs, annual cost of ownership, and relatively short lifespan of the heat wheel have rendered this approach impractical for many data centers.

SUMMARY OF THE INVENTION

In the present invention, sensible heat rejection of the data center space containing heat generating equipment is achieved by recirculating the conditioned primary air stream through a plate-type cross-flow heat exchanger, in which the cross-flow consists of a totally segregated cooler secondary ambient air stream. The air-to-air cross-flow heat exchanger is comprised of a series of parallel square or rectangular plates, which define a series of orthogonally alternating air passageways. This cross-flow design effectively prevents the mixing or cross contamination of the primary and secondary air streams and thus avoids the efficiency losses due to leakage between the air streams, which is inherent in wheel type heat exchangers. Elimination of leakage prevents the transfer of harmful contaminates, particulate, humidity, and/or pressure fluctuations from the cooler ambient secondary air stream to the primary critical data center air stream.

Since the air-to-air plate type heat exchanger of the present invention does not involve moving parts, it conserves energy as compared to the motor-driven heat wheel and does not require regular inspection and/or maintenance. Because it provides less constricted air passageways than the heat wheel, there is comparatively less pressure drop across the indirect cross-flow plate heat exchanger. Consequently, less system fan power is required to provide the required flow. The plate type heat exchanger also has a lower capital cost than the wheel type for comparable performance. Since the present invention does not have a limited lifespan, in contrast to the heat wheel's expected life cycle of approximately 10 years, system longevity is greatly improved. Overall, therefore, the system of the present invention, applying the plate type air-to-air heat exchanger for data center climate control, is more cost effective than the existing systems that instead rely upon heat wheels.

In the present invention, the principal method of climate control for the heat-generating data center space comprises heat transfer, across the plate type cross-flow heat exchanger, from the primary recirculating air stream (RAS) to the ambient outside air stream (OAS) during conditions when the OAS temperature is lower than the return RAS temperature. When the temperature differential between the ambient air and the return RAS is not sufficient to achieve cooling of the RAS to the design temperature range of the data center equipment, supplemental mechanical cooling by a refrigerant-based or chilled-liquid cooling system is provided.

Indirect and/or direct evaporative (adiabatic) cooling may also be added to the present invention to provide significant benefits to the system. These benefits include, but are not limited to, an expanded and more effective "free" cooling range whereby the need for mechanical cooling is reduced, an expanded system operating and economizing range, an increase in overall unit efficiency, and enhanced application flexibility, which facilitates installation and integration into existing and future data center design paradigms. The present invention is typically outfitted with humidification provisions which are generally located downstream of the cross-flow heat exchanger. The humidification may originate from a variety of sources such as atmospheric steam, pressurized steam, high pressure atomized water, and others. When moisture levels in the space are greater than approximately 40% relative humidity, a liquid "film" tends to agglomerate on the surfaces. This "film" serves to mitigate the accumulation of static electricity (charge) which can damage sensitive electronic equipment if permitted to accumulate and discharge.

As an option, the system can be outfitted with a subsequent humidification manifold upstream of the cross-flow heat exchanger to leverage the indirect evaporative cooling principle to pre-cool the outside air stream. The evaporative cooling effect is characterized by the spontaneous evaporation of the liquid and an accompanying cooling effect. As liquid droplets evaporate, a phase change occurs from the liquid to gaseous phase with heat being absorbed in the process. The result is an energy removal which includes a temperature reduction or cooling effect. This example is characterized as "indirect" because the evaporative humidifier grid does not actually add the mist to the outside air stream, but rather to the cross-flow heat exchanger coil. Thus no mist ever contacts the air stream. It is essential to note that due to the inherent design characteristics of the prior art, an indirect evaporative cooling strategy may be impossible to successfully implement.

While it is not required, the same means to generate humidity when the space humidity levels are low, such as a pressurized water humidifier and/or pumping unit, may be leveraged to provide evaporative cooling without actually adding additional humidity when cooling of the outside air stream is required. This can be accomplished simply by switching the destination manifold for the humidification supply. This provision provides a temperature reduction of the outside air stream without the need for mechanical cooling while simultaneously increasing the overall effectiveness of the cross-flow heat exchanger. The net effect is therefore a reduction of mechanical cooling required and in increased economizing range where mechanical cooling is simply not required at all. Thus, the required physical size and capacity of the cooling coil can be comparatively reduced. It should be noted that evaporative cooling may be implemented as indirect, per the aforementioned treatment, or as direct whereby the liquid mist is injected directly into the airstream. Both paradigms are effective at providing notional energy savings in data centers.

A logic based optimized control system, utilizing a master controller, receives real-time information from a variety of sensors and continuously modulates operational set-points of strategic control mechanisms to optimize unit operation. One embodiment of the present invention can be characterized as a fully-integrated information and communication technology (ICT) center indirect air-side economizer unit with real-time optimization and adaptability. Volumetric flow in both the primary and secondary air streams is independently controllable, entirely separated, and infinitely adjustable with variable frequency drives. The control system modulates the OAS fans, from off to full flow as required thereby proportionally regulating heat transfer from the OAS to the RAS at all times. When ambient temperature, read by an array of temperature sensors, equals or exceeds that of the return RAS, the control system will then modulate the mechanical cooling provisions, as required.

The OAS fans can be varied to provide the optimal quantity of ambient cooling when ambient temperature is below that of the return RAS. The control system regulates the level of mechanical cooling based on OAS and return RAS temperatures so as to cool the RAS to the design temperature range for the data center equipment. When the system detects the full load set point OAS temperature, sufficiently lower than the return RAS temperature to enable cooling to the equipment design range without supplemental mechanical cooling, the mechanical cooling is deactivated.

When the ambient temperature falls below the full load set point, the control system reduces to speed of the OAS fan(s), using a variable frequency drive (VFD) system, based on return RAS temperature.

In the event OAS temperature drops below the freezing point of water, the control system implements measures to prevent condensation and freezing on the plate heat exchanger surfaces and/or overcooling of the RAS. These measures involve a partial bypass on the OAS side of the air-to-air heat exchanger, in which warmed OAS exiting the heat exchanger is redirected back into the OAS fan inlet to raise the temperature of the OAS entering the heat exchanger above the frost point. The control system implements these measures, through set points based on RAS humidity and OAS temperature, after the OAS fans had been turned down to the minimum speed required to maintain a minimum air flow across the heat exchanger.

The present invention is fully scalable and customizable. One embodiment of the cross-flow plate heat exchanger section incorporates a tunnel airflow design that is completely modular. Multiple standardized sections can be ganged together, in series or parallel, to provide an expansive array of configurations in various system capacities. This can be accomplished during the manufacturing phases or after installation. Additional modules can be field retrofitted to provide extensive field scalability. Moreover, the unit itself can be constructed on-site or supplied fully-assembled so as to offer flexible installation options. Equipment space claim and field adjustability has proven to be a concern for many ICT facilities and the present invention seeks to provide a viable solution.

The foregoing summarizes the general design features of the present invention. In the following sections, specific embodiments of the present invention will be described in some detail. These specific embodiments are intended to demonstrate the feasibility of implementing the present invention in accordance with the general design features discussed above. Therefore, the detailed descriptions of these embodiments are offered for illustrative and exemplary purposes only, and they are not intended to limit the scope either of the foregoing summary description or of the claims which follow.

DETAILED DESCRIPTION OF THE PREFERRED EMBODIMENT

Figure 1:
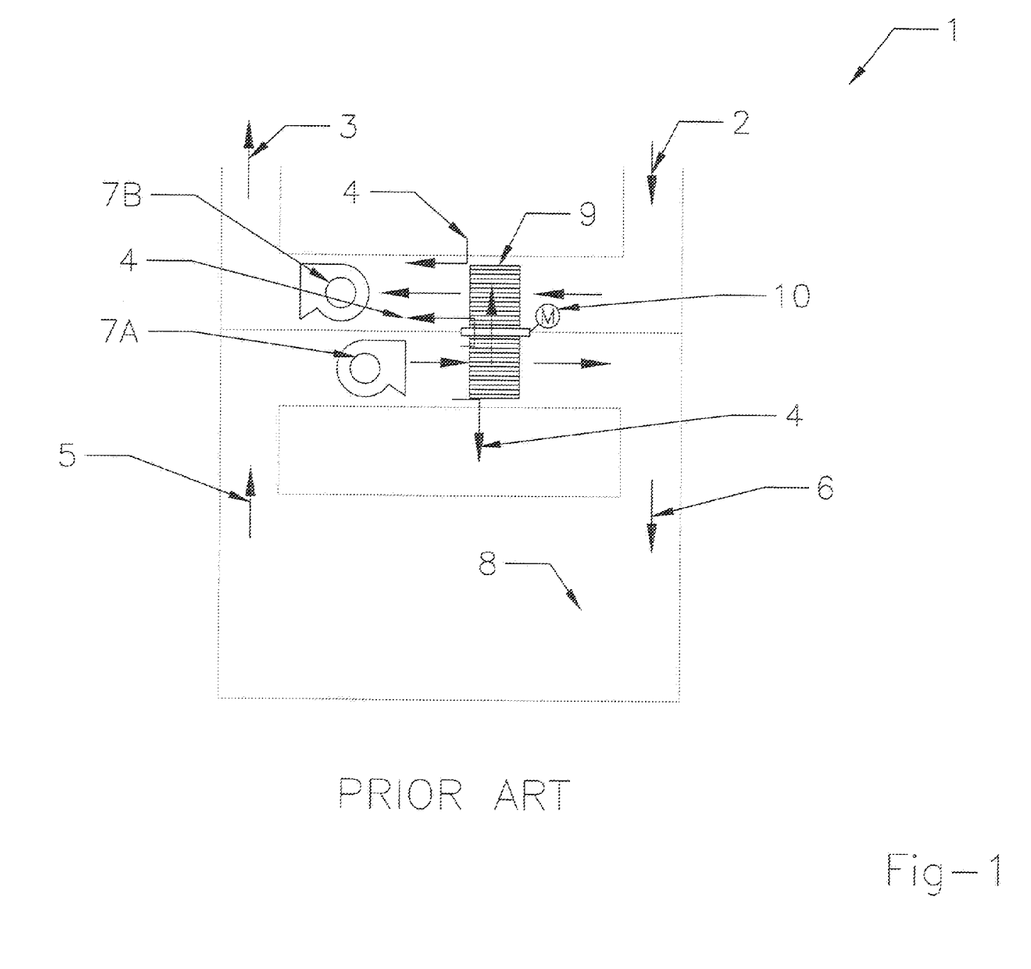
FIG. 1 is a schematic depiction of a prior art air-to-air heat exchanger of the rotary heat wheel type.

Referring to FIG. 1, the prior art heat wheel type air-to-air heat exchanger 1 transfers heat generated by a climate-controlled data center space 8 to an outside air stream (OAS) 2 exhausting to ambient 3. The heat wheel 9 rotates, by means of a motor 10, through a partition between a primary air flow, consisting of the recirculating air stream (RAS) 5 6, and a secondary air flow, consisting of the OAS 2 3. The RAS consists of a warm return air stream 5 and a conditioned supply air stream 6. The OAS consists of an intake air stream 2 and an exhaust air stream 3. Fans 7A 7B generate pressure to move the primary and secondary air flows through the perforated heat wheel 9. Leakage across the partition 4 between the primary and secondary air flows reduces the heat transfer efficiency of this type of system. The fan position in the system is therefore critical, which limits flexibility of system design for this embodiment.

Figure 2:
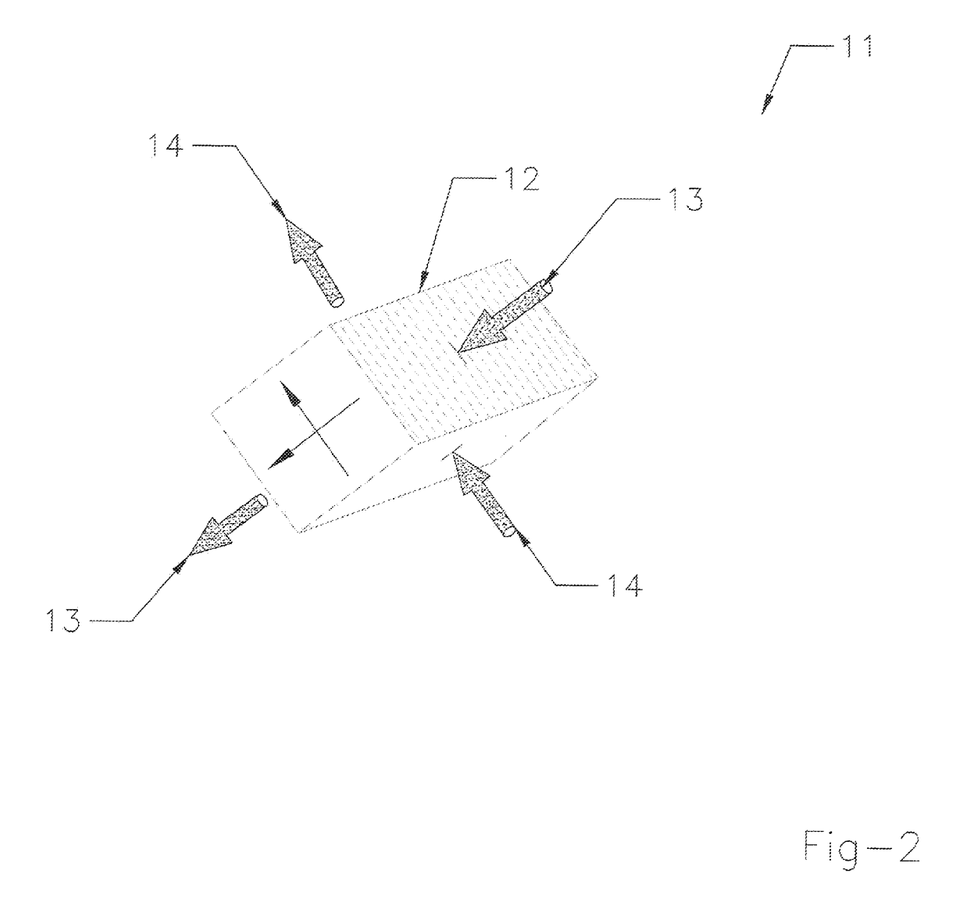
FIG. 2 is an isometric detail view of a cross-flow plate type air-to-air heat exchanger, which is a primary component of some embodiments of the present invention.

Referring to FIG. 2, the present invention replaces the rotary heat wheel of FIG. 1 with a cross-flow plate type air-to-air sensible heat exchanger 11, comprising a series of parallel square or rectangular plates 12, which define a series of orthogonally alternating air passageways 13 14. The primary air flow 13, comprising the supply and return RAS, is segregated from the secondary air flow 14, comprising the intake and exhaust OAS, as they pass through the heat exchanger 11. The temperature differential of the two air flows 13 14 and the duration of their passage through the heat exchanger 11 determines the amount of heat transferred from the primary 13 to the secondary 14 and the efficiency of the sensible heat exchanger 11.

Figure 3:
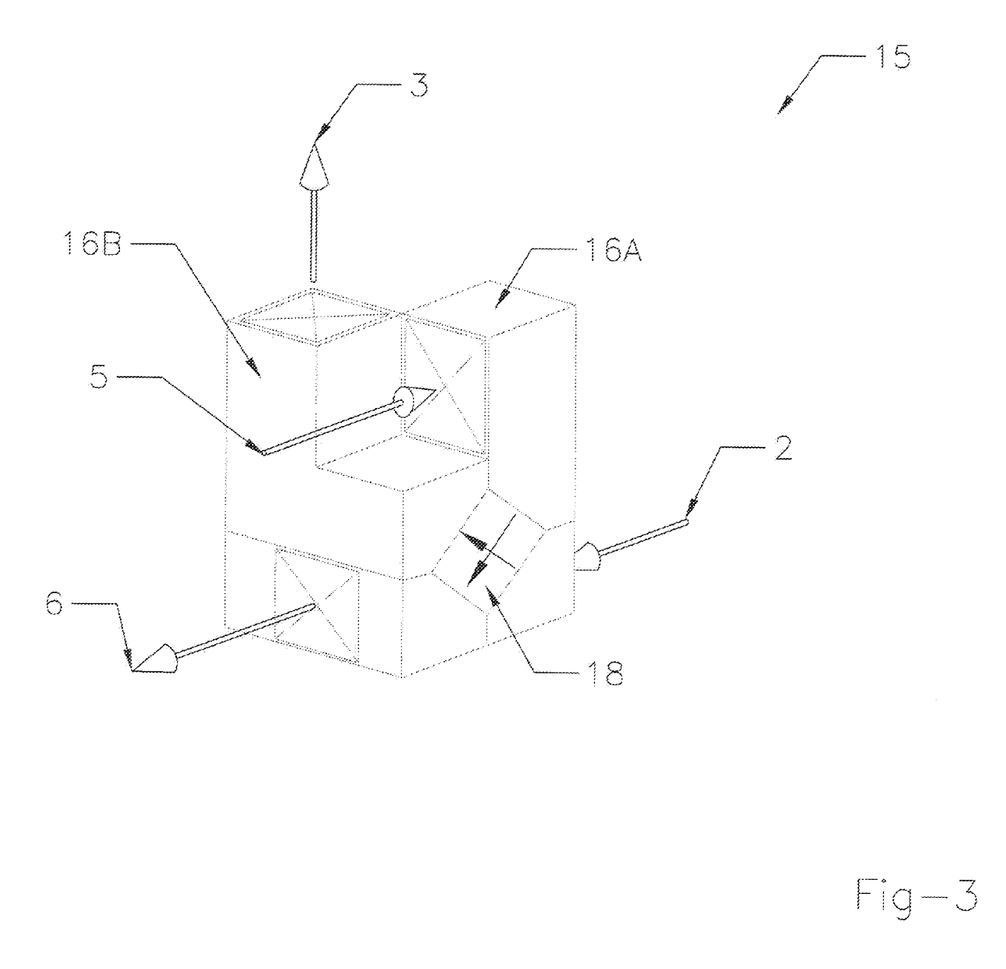
FIG. 3 is an isometric view of a modular air-to-air cross-flow plate heat exchanger with airflow segregation tunnel design, which is a component of some embodiments of the present invention.

Referring to FIG. 3, a modular component of one embodiment of the present invention 15 combines the plate type cross-flow heat exchanger 11 of FIG. 2 with air flow segregation tunnels 16. The heated return RAS 5 enters the primary tunnel 16A, passes through the cross-flow plate heat exchanger 18 (designated by crossed arrows), and exits through the primary tunnel 16A as the cooled supply RAS 6. Within the heat exchanger 18, the return RAS 5 transfers some of its heat to the intake OAS 2, which enters the segregated secondary tunnel 16B, passes orthogonally to the primary flow through the heat exchanger section 18, and exits through the secondary tunnel 16B to ambient as the exhaust OAS 3.

With this design, separate air streams are routed through tunnels 16A 16B as they enter the air-to-air cross flow plate heat exchanger section 18. This design essentially optimizes the approach and discharge characteristics of the two airstreams and provides a mechanism for a modular design. Therefore, any multiple of modules may be added, making this system adaptable for a wide range of system capacities.

Figure 4:
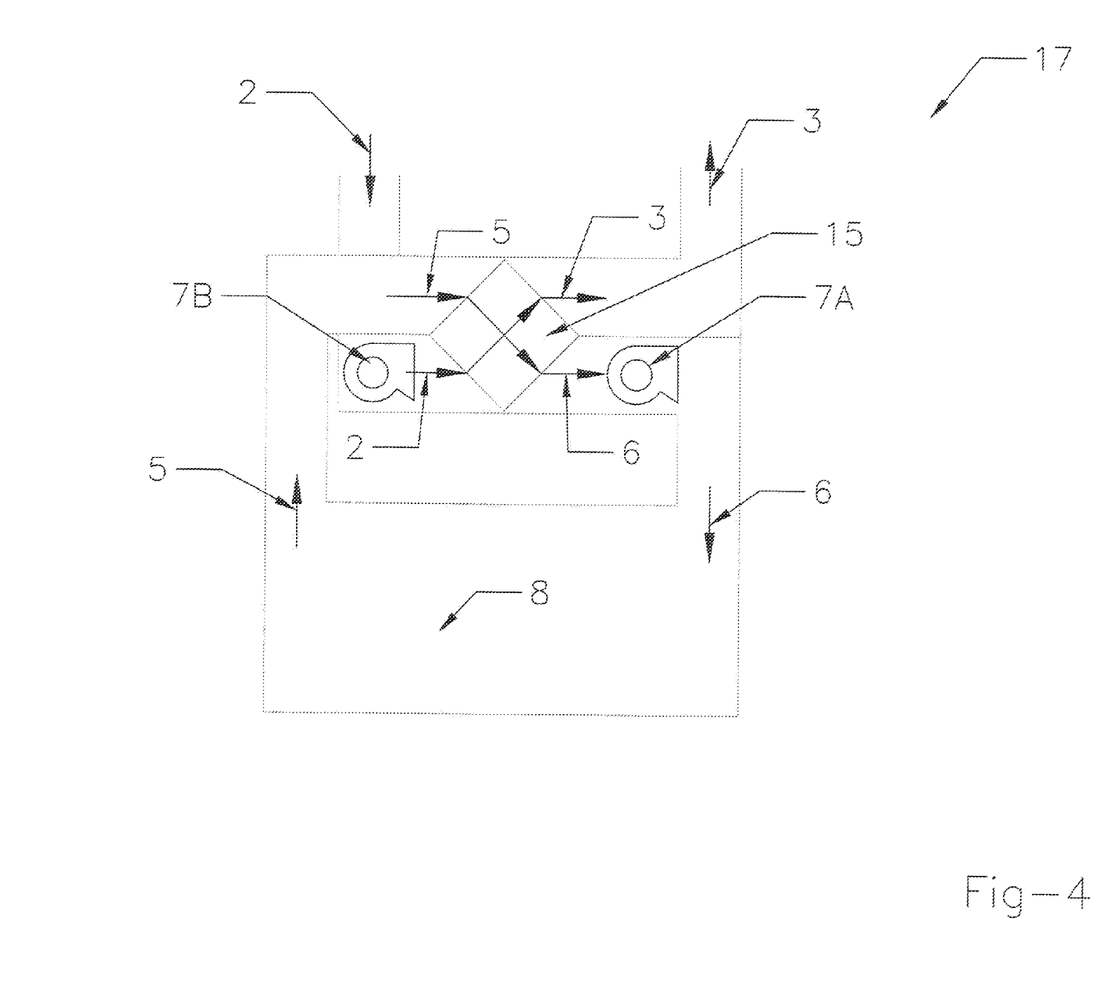
FIG. 4 is a schematic depiction of the modular air-to-air cross-flow plate heat exchanger with airflow segregation tunnel design, of the type depicted in FIG. 3, as applied to a data center application, in accordance with some embodiments of the present invention.

Referring to FIG. 4, the modular air flow segregation tunnel design 15 shown in FIG. 3 is applied 17 to a climate-controlled data center space 8. A fan 7A downstream of the heat exchanger 15 draws the warm return RAS 5 through the heat exchanger module 15 and blows the cooled supply RAS 6 back into the data center space 8. A fan 7B upstream of the heat exchanger module 15 draws the intake OAS 2 into the module 15 and blows it through the heat exchanger module 15 and out as the exhaust OAS 3.

Figure 5:
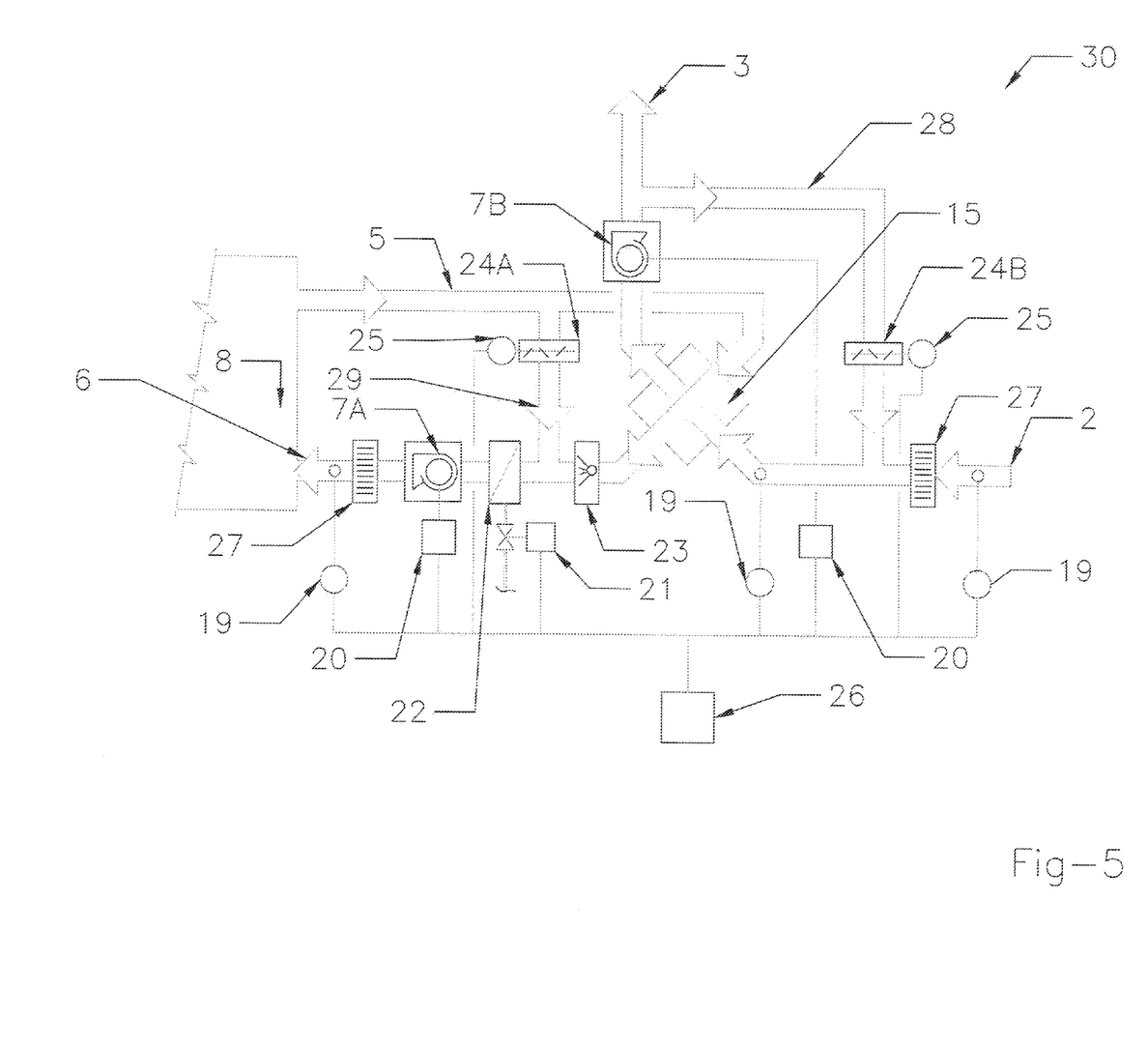
FIG. 5 is a schematic depiction of a data center climate control system with supplemental mechanical cooling according to one embodiment of the present invention.

Referring to FIG. 5, a data center climate control system with supplemental mechanical cooling 30 is schematically depicted. This configuration incorporates bypasses for both the primary and secondary air flows in order to accommodate a wide range of ambient temperature conditions.

Beginning with the primary air flow, when the ambient temperature, as detected by the sensor 19, rises above that of the return RAS 5, the intake OAS 2 is shut off by stopping the exhaust fan 7B. At the same time the primary bypass damper 24A is opened, so as to divert the return RAS 5 to the primary bypass route 29, where it is cooled by a mechanical unit 22, which can be either refrigerant direct expansion or chilled water.

With respect to the secondary air flow, when the ambient temperature, as detected by the sensor 19, is below that of the return RAS 5, the exhaust fan 7B is activated to draw the intake OAS 2 through the segregated tunnel heat exchanger module 15. The rate at which the intake OAS 2 passes through the module 15 is regulated by the speed of the exhaust fan 7B, which is in turn regulated by a variable frequency drive 20.

As the temperature differential between the intake OAS 2 and the return RAS 5 increases, the exhaust fan speed 7B is slowed down so as to decrease the volumetric flow rate of the OAS 2 through the heat exchanger module 15, thereby decreasing the rate at which primary heat is transferred to the secondary air flow. When exhaust fan speed 7B reaches a minimum needed to maintain a secondary air flow across the module 15, the system begins to implement a secondary air flow bypass mode.

When the detected ambient temperature falls below a pre-determined set point based on the humidity of the return RAS 5, a secondary air flow bypass mode is activated to prevent condensation and/or freezing within the heat exchanger module 15. In this mode, the secondary bypass damper 24B is opened, so that some of the heated exhaust OAS 3 is diverted through the secondary bypass route 28 back to the intake side of the module 15, thereby mixing with the intake OAS 2 to raise its temperature above the set frost or dew point.

As shown in FIG. 5, this embodiment also includes primary and secondary air flow filters 27, a primary supply side humidifier 23, damper actuators 25, a mechanical cooling control valve 21, and a master system controller 26.

In the system depicted in FIG. 5, the secondary exhaust fan 7B is located downstream of the heat exchanger module 15 and the primary supply fan 7A is located downstream of the mechanical cooling unit 22. This arrangement leverages the fan heat of compression to maximize the cooling effect of the OAS 2, while simultaneously providing sensible heat gain to the air saturation potential for the supply RAS 6. In the alternate configuration depicted in FIG. 6, the secondary air flow fan 7B has been relocated to upstream of the heat exchanger module 15.

Figure 6:
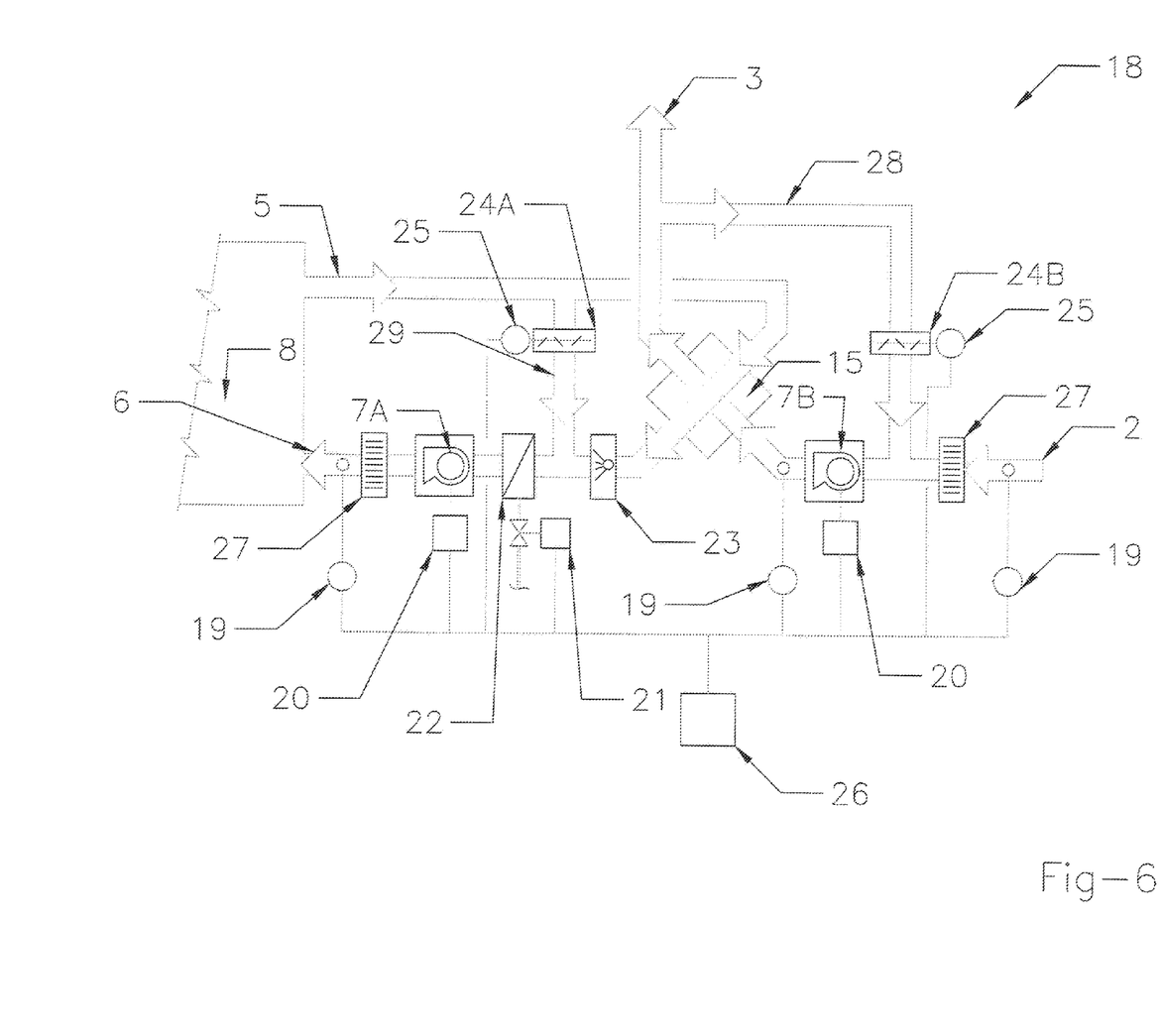
FIG. 6 is a schematic depiction of a data center climate control system with supplemental mechanical cooling according to an alternate embodiment of the present invention.
Figure 7:
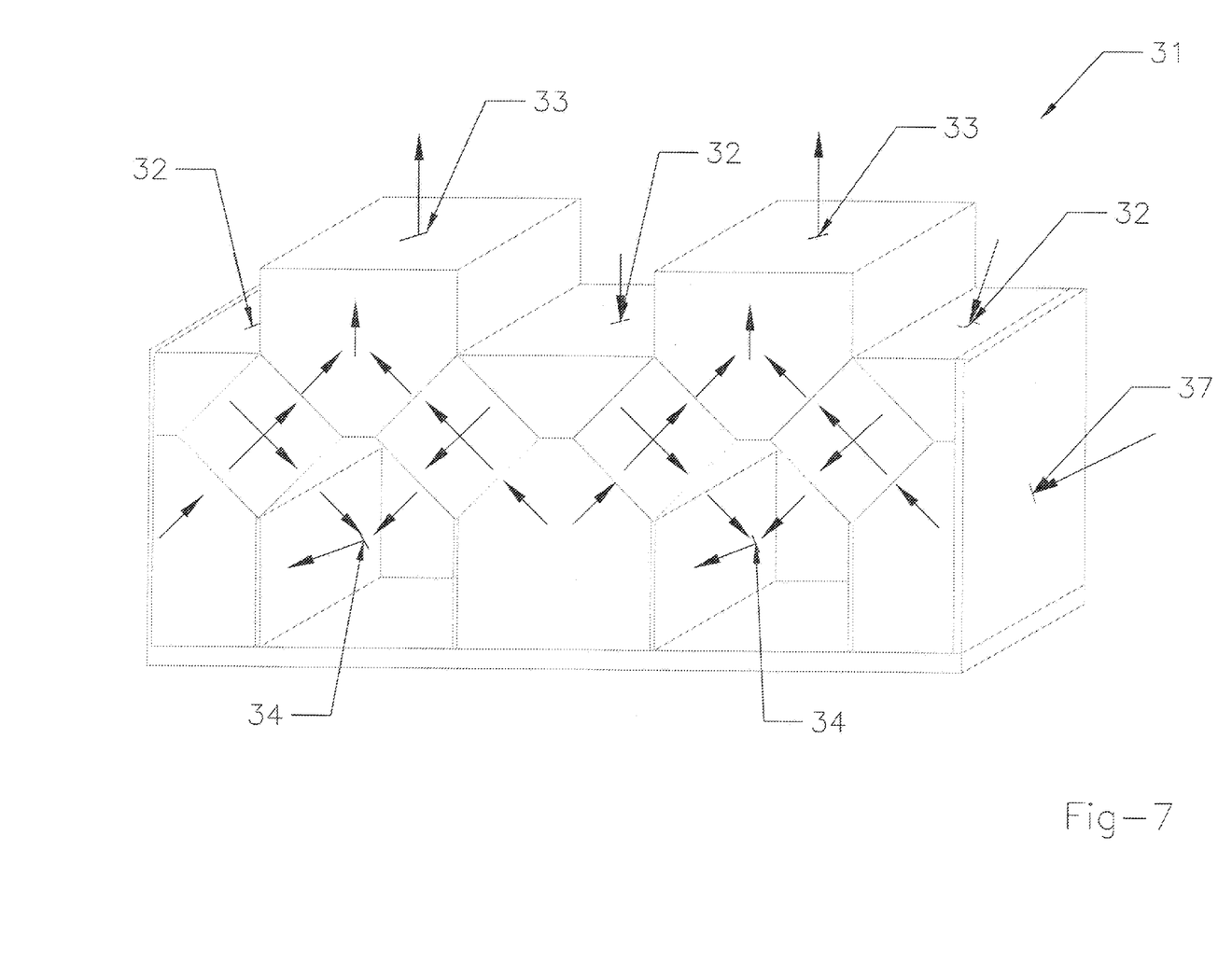
FIG. 7 is a perspective view of a series of integrated modular air-to-air cross-flow plate heat exchangers with airflow segregation tunnel design, of the type depicted in FIG. 3, providing an adjustable overall system capacity, according to one embodiment of the present invention.

Optional upstream evaporative cooling of the intake OAS 2 can be implemented by relocating, or adding a subsequent humidifier 23 (and/or its destination manifold), as shown in FIGS. 5 and 6, to a location upstream of the heat exchanger module 15. This option reduces reliance on the mechanical cooling unit 22, thereby saving energy FIG. 7 depicts an integrated series of modular air-to-air plate heat exchangers 31 having the flow segregation tunnel design shown in FIGS. 3 and 4. Each module in this series has a return RAS inlet 32, a supply RAS outlet 34, an intake OAS inlet 37, and an exhaust OAS outlet 33. This illustrates that the modular design can be grouped in multiples to afford an adjustable overall system capacity.

Figure 8:
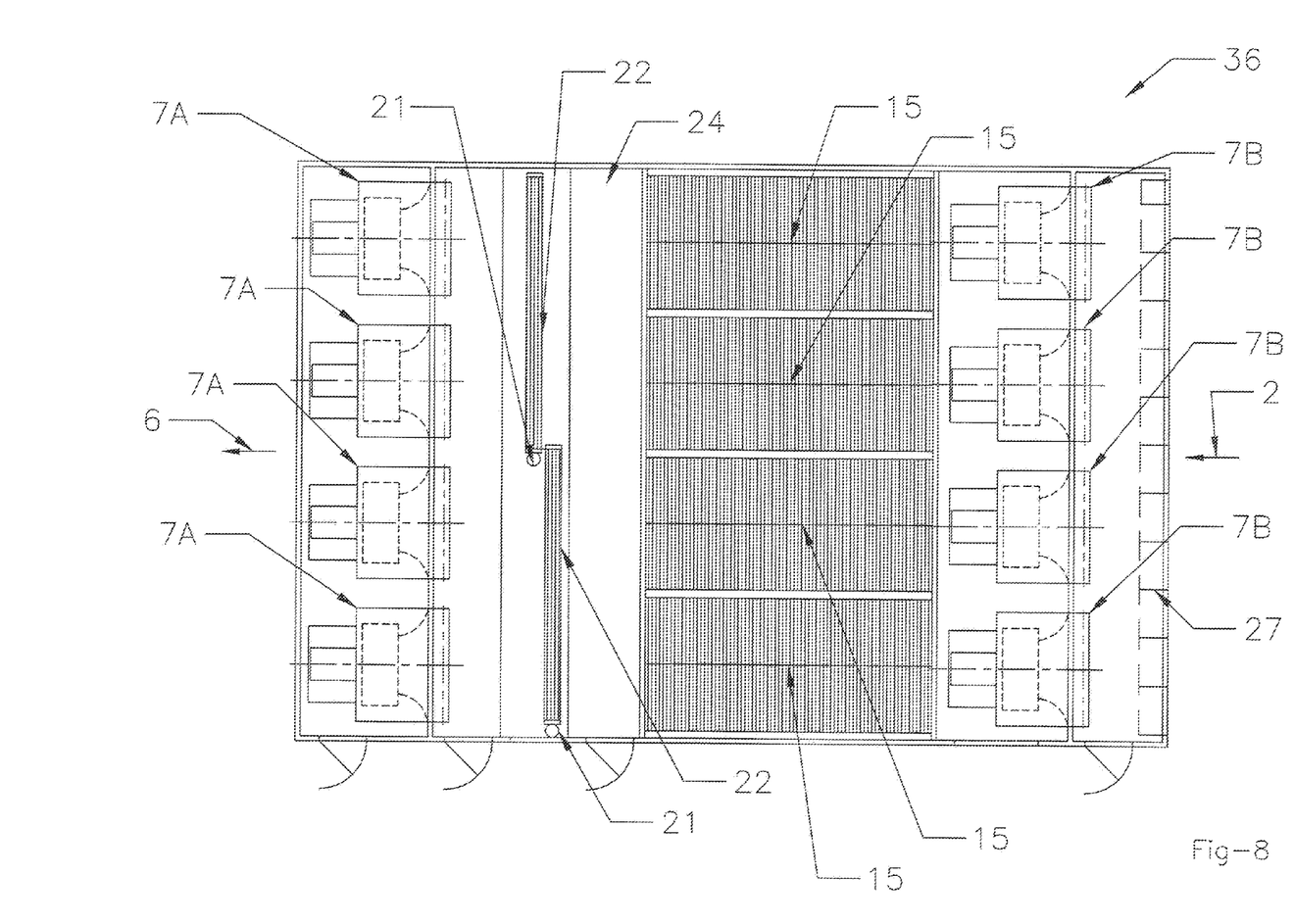
FIG. 8 is a plan view of one embodiment of the modular version of the present invention, comprising four heat exchanger modules "ganged" together.

FIG. 8 depicts an integrated series of four modular air-to-air plate heat exchangers 36, with fans 7A 7B and supplemental mechanical cooling units 22, as well as OAS intake filters 27 and a primary bypass damper 24.

Although the preferred embodiments of the present invention have been disclosed for illustrative purposes, those skilled in the art will appreciate that many additions, modifications and substitutions are possible, without departing from the scope and spirit of the present invention, as defined by the accompanying claims.

What is claimed is:

1. A climate control system for a heat-generating data center space, comprising:
   an air-to-air cross-flow heat exchanger, comprising a series of parallel square or rectangular heat exchange plates, which define a series of orthogonally alternating air passageways, consisting of multiple primary airflow passageways and multiple secondary airflow passageways, wherein the primary airflow passageways are orthogonal to and segregated from the secondary airflow passageways;
   a logic-based master system controller and an exhaust fan having a variable exhaust fan speed;
   a primary recirculating air stream, which is circulated and recirculated through the data center space, wherein the primary recirculating air stream comprises a conditioned supply air stream, which enters the data center space at a controlled supply air temperature, and a heated return air stream, which exits the data center space at a return air temperature, which exceeds the supply air temperature;
   a secondary outside air stream, which is drawn from an ambient, wherein the secondary outside air stream comprises an intake air stream, which is drawn from the ambient into the climate control system at an intake air temperature that is lower than the return air temperature by an intake temperature decrement, and an exhaust air stream, which is exhausted back into the ambient at an exhaust temperature, which exceeds the intake air temperature;
   wherein the return air stream at the return air temperature is circulated from the data center space into and through the primary airflow passageways of the heat exchanger and is recirculated, as the supply air stream at the supply air temperature, back to the data center space, while concurrently the intake air stream at the intake air temperature is drawn from the ambient into and through the secondary airflow passageways of the heat exchanger and is exhausted, as the exhaust airstream at the exhaust air temperature, back into the ambient;
   wherein heat from the return air stream is transferred at a primary heat exchange rate through the heat exchange plates of the heat exchanger to the intake air stream, thereby cooling the primary recirculating air stream to the supply air temperature, at which temperature the primary recirculating air stream is recirculated back to the data center space as the supply air stream, and thereby heating the secondary outside air stream to the exhaust air temperature, at which temperature the outside air stream is exhausted back into the ambient as the exhaust air stream;
   wherein the master system controller receives real-time temperature data from two or more temperature sensors, which monitor the intake air temperature and the return air temperature, and wherein the master system controller controls the exhaust fan speed so as to regulate a volumetric flow rate of the intake air stream through the heat exchanger; and
   wherein the master system controller is programmed so that, when the intake temperature decrement increases, the exhaust fan speed is reduced so as to reduce the volumetric flow rate of the intake air stream through the heat exchanger and thereby reduce the primary heat exchange rate so as to maintain the supply air temperature within a designated climate control range, and wherein, when the intake temperature decrement decreases, the exhaust fan speed is increased so as to increase the volumetric flow rate of the intake air through the heat exchanger and thereby increase the primary heat exchange rate so as to maintain the supply air temperature within the designated climate control range.

2. The climate control system of claim 1, wherein the master system controller is programmed so that, when the intake temperature decrement increases to an extent that the exhaust fan speed reaches a minimum needed to maintain a flow of the intake air stream through the heat exchanger, a secondary bypass damper is opened so as to divert a bypass portion of the exhaust air stream through a secondary bypass route back into the secondary airflow passageways of the heat exchanger, wherein the bypass portion of the exhaust air stream mixes with and warms the intake air stream, thereby decreasing the intake temperature decrement so as to increase the exhaust fan speed and restore the flow of the intake air stream through the heat exchanger.

3. The climate control system of claim 2, wherein the master system controller is programmed so that, when the temperature sensors detect that the intake air temperature has fallen below a bypass set point, at which condensation and/or freezing within the heater exchanger will occur, the secondary bypass damper is opened so as to divert a bypass portion of the exhaust air stream through a secondary bypass route back into the secondary airflow passageways of the heat exchanger, wherein the bypass portion of the exhaust air stream mixes with and warms the intake air stream, thereby producing a mixed intake-exhaust air stream having a temperature above the bypass set point, so as to prevent condensation and/or freezing within the heat exchanger.

4. The climate control system of claim 3, wherein the master system controller is programmed so that, when the temperature sensors detect that the intake air temperature has risen above the return air temperature, the exhaust fan is shut off, and a primary bypass damper is opened so as to divert the return air stream through a primary bypass route into a mechanical cooling unit, whereby the return air stream is cooled to a temperature within the designated climate control range.

5. The climate control system according to any one of claims 1 and 2-4, wherein the heat exchanger comprises multiple ganged heat exchanger modules, each of which is configured such that the primary recirculating air stream is circulated through the primary airflow passageways and recirculated back to the data center space via a primary tunnel, having a primary tunnel inlet and a primary tunnel outlet, and such that the secondary outside airstream is drawn or blown through the secondary airflow passageways and exhausted back into the ambient via a secondary tunnel, and wherein the primary tunnel and the secondary tunnel are segregated and do not communicate, and wherein the primary tunnel outlets of one or more upstream ganged heat exchanger modules are connected to the primary tunnel inlets of one or more downstream ganged heat exchanger modules, such that the primary recirculating airstream is circulated serially through multiple interconnected primary tunnels of the multiple ganged heat exchanger modules before recirculating back to the data center space.

6. The climate control system according to any one of claims 1 and 2-4, further comprising an evaporative cooling element located, or having a manifold outlet located upstream of the heat exchanger, wherein the evaporative cooling element injects a mist, comprising liquid water droplets, into the heat exchanger or into the intake air stream or into both the heat exchanger and the intake air stream, such that evaporation of some or all of the liquid water droplets cools the intake air stream.

7. The climate control system of claim 5, further comprising an evaporative cooling element located, or having a manifold outlet located upstream of the heat exchanger, wherein the evaporative cooling element injects a mist, comprising liquid water droplets, into the heat exchanger or into the intake air stream or into both the heat exchanger and the intake air stream, such that evaporation of some or all of the liquid water droplets cools the intake air stream.

\* \* \* \* \*